United States Patent
Koga

(10) Patent No.: US 6,818,915 B1
(45) Date of Patent: Nov. 16, 2004

(54) FIELD-EMISSION ELECTRON SOURCE

(75) Inventor: Keisuke Koga, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/622,734
(22) PCT Filed: Mar. 19, 1999
(86) PCT No.: PCT/JP99/01423
§ 371 (c)(1),
(2), (4) Date: Nov. 27, 2000
(87) PCT Pub. No.: WO99/49491
PCT Pub. Date: Sep. 30, 1999

(30) Foreign Application Priority Data

Mar. 23, 1998 (JP) .......................... 10-073828
Oct. 20, 1998 (JP) .......................... 10-298250

(51) Int. Cl.⁷ .......................... H01L 29/12; H01J 19/10
(52) U.S. Cl. .............................. 257/10; 257/9; 313/336
(58) Field of Search .............................. 257/9–10, 249, 257/401; 313/336; 315/167, 169.1–169.2, 309, 2

(56) References Cited

U.S. PATENT DOCUMENTS 4,968,639 A * 11/1990 Bergonzoni ................. 437/57
5,396,096 A * 3/1995 Akamatsu et al. .......... 257/336
5,550,435 A * 8/1996 Kuriyama et al. ....... 315/169.1
5,965,921 A * 10/1999 Kojima ....................... 257/369

FOREIGN PATENT DOCUMENTS

| EP | 0845815 A2 | * | 6/1998 | ........... H01L/29/78 |
|---|---|---|---|---|
| JP | 60-22375 | | 2/1985 | |
| JP | 60022375 A | * | 2/1985 | ........... H01L/29/78 |
| JP | 60-55616 | | 3/1985 | |
| JP | 360124872 A | * | 7/1985 | ........... H01L/29/78 |
| JP | 62-229880 | | 10/1987 | |
| JP | 64-61953 | | 3/1989 | |
| JP | 2-9134 | | 1/1990 | |
| JP | 7-130281 | | 5/1995 | |
| JP | 8-87957 | | 4/1996 | |
| JP | 9-063467 | | 3/1997 | |
| JP | 409063467 A | * | 3/1997 | ............. H01J/1/30 |
| JP | 10-74473 | | 3/1998 | |
| JP | 11-102637 | | 4/1999 | |

OTHER PUBLICATIONS

S.M. Sze, "Physics of Semiconductor Devices", Second Edition, John Wiley & Sons, New York (1981); pp. 433–434.*

* cited by examiner

Primary Examiner—Minhloan Tran
Assistant Examiner—Johannes Mondt
(74) Attorney, Agent, or Firm—RatnerPrestia

(57) ABSTRACT

The field emission type electron source device of the present invention includes: a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction portion; and an n-channel field effect transistor portion provided on the p-type silicon substrate, corresponding to the field emission electron source portion. The field emission electron source portion is provided in a drain region of the field effect transistor portion. A control voltage is applied to a gate electrode of the field effect transistor portion to control a field emission current from the field emission electron source portion. The drain region includes at least two wells having different impurity concentrations. Of the at least two wells, one well having a low impurity concentration is provided at an end of the drain region which contacts a channel region of the field effect transistor portion.

21 Claims, 9 Drawing Sheets (a)

(b)

(a)

(b)

(a)

(b)

(a)

(b)

(a)

(b)

(a)

(b)

(a)

(b)

PRIOR ART

PRIOR ART

1

FIELD-EMISSION ELECTRON SOURCE

This Application is a U.S. National Phase Application of PCT International Application PCT/JP99/01423.

TECHNICAL FIELD

The present invention relates to a cold cathode electron source which is sought after for use in applications such as electron-ray excited lasers, elements for a flat type display, and ultra-fast micro vacuum elements. More particularly, the present invention also relates to a semiconductor-applied field emission type electron source which can be integrated and requires a low voltage and a method for producing the same.

BACKGROUND ART

Semiconductor micro-processing technology has made progress so that a micro cold cathode structure can be constructed. This leads to vigorous development of vacuum micro electronics technology. Such a micro cold cathode structure obtained by this technology is thought to achieve a flat-type electron emission characteristic and a high level of current density. In particular, this micro cathode structure is therefore believed to serve as an electron source of a next-generation flat display. Further, the structure has an operating temperature in a range wider than that of a liquid crystal display mode such as a TFT-LCD. For this reason, such a cathode structure is thought to be useful in a display which is carried on vehicles and is required to be resistant to harsh environments.

A reduction in operating voltage, a stable electron emission characteristic, a long life characteristic, and the like are required for these electron sources when used for a flat display. In particular, the stable electron emission characteristic is directly involved in brightness which is basic to the performance of a display, regarded as an important technological target.

To obtain this goal, a method in which a resistor layer is inserted inside the electron source, a method in which a constant-current circuit is incorporated into the electron source and the like have been proposed.

Hereinafter, the configuration of a field emission cold cathode device described in Japanese Laid-Open Publication No. 8-87957 will be described with reference to FIGS. 8(a) and 8(b). This first conventional example adopts a principle such that a constant emitted electron flow amount of a field emission cathode element is obtained using the constant current characteristic of a field effect transistor (FET). FIG. 8(a) is a cross-sectional view of a part of a silicon substrate on which a field emission cathode element and a FET are provided. FIG. 8(b) is a circuit configuration diagram showing an electrical equivalent circuit of the part including the field emission cathode element.

In FIGS. 8(a) and 8(b), reference numeral 810 denotes a field effect transistor (FET); 801 a p-type silicon substrate; 802 a first n-type layer which serves as the source of the FET 810; 803 a cone-shaped emitter of the field emission cathode element; 804' a part of an isolating layer (SiO$_2$ layer) 804, the part functioning as a gate isolating layer of the field emission cathode element; 805 a gate layer of the field emission cathode element; 806 a second n-type layer which serves as the drain of the FET 810; 807 the source electrode of the FET 810; 808 the gate electrode of the FET 810; 809 the anode of the field emission cathode element; 811 a source resistor; 812 a gate voltage source (voltage value Vg); 813 an anode voltage source (voltage value Va); and 814 a gate-to-source control voltage source (voltage value Vgs).

As shown in FIG. 8(b), the field emission cathode element has a structure of a triode including the anode (A) 809, the gate (G) 805, and the emitter (E) 803. The drain-source path and source resistor 811 of the FET 810 are connected in series between the emitter (E) 803 and the ground.

In this triode, the anode (A) 809 is connected to the anode voltage source 813 which generates the anode voltage Va. The gate (G) 805 is connected to the gate voltage source 812 which generates a fixed gate voltage Vg. In the FET 810, the gate 808 is connected to the gate-to-source control voltage source 814 which generates a variable gate-to-source control voltage Vgs.

In the field emission cathode element for use in a field emission cathode device, a predetermined anode voltage Va and a predetermined gate voltage Vg are applied to the anode 809 and the gate 805, respectively. When a predetermined value of gate-to-source control voltage Vgs is then applied to the gate 808 of the FET 810, emitted electron flow is generated from the emitter 803 without heating the emitter 803. In this case, the amount of the emitted electron flow by the field emission cathode element is not controlled by the fixed gate voltage Vg applied to the gate 805, but is controlled by the variable gate-to-source control voltage Vgs applied to the gate 808 of the FET 810 connected to the emitter 803. In other words, an appropriate gate-to-source control voltage Vgs applied to the gate 808 of the FET 810 allows the FET 810 to operate in a constant current region.

As described above, the amount of the emitted electron flow from the emitter caused by field emission is determined by a characteristic of the FET which is connected in series to the emitter and has a function of supplying electrons which will be emitted. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission current amount can be obtained.

Among specifications required for a cold cathode is a high definition which is a very important factor for a display application. In general, in the case of a micro-chip-type cold cathode structure, the emitter emits electrons at a predetermined divergent angle. This is likely to be detrimental. A structure using a focus electrode has been proposed to provide a means for preventing the divergence of an electron path. FIG. 9 shows a configuration example of an FED using such a structure, as a second conventional example, which is disclosed in Japanese Laid-Open Publication No. 10-74473.

In this FED, a second gate electrode (focus electrode) is formed for each emitter. This gate electrode receives a potential which is negative relative to a first gate electrode (extraction gate electrode) so as to converge electrons emitted from the emitter.

In other words, in FIG. 9, reference numeral 91 denotes an insulating layer. An insulating layer 93 is further provided on a gate electrode (extraction electrode) 92. On the insulating layer 93 a second gate electrode (focus electrode) 94 which has a round opening portion is provided. In this conventional example, the second gate electrode (focus electrode) 94 is provided in such a manner as to surround each emitter 95. This second gate electrode (focus electrode) 94 is set to a potential lower than the first gate electrode (extraction gate electrode) 92 so that electrons emitted from the emitter are affected by a lens action having a convergence effect. This causes the electron beam paths to converge.

However, the field emission type cathode element of the above-described first conventional example can control the field emission current to be stable for a short time period. In some operating condition, the stability is not secured for a long time period.

Further, whereas the field emission type display device of the second conventional example has a function of converging electron beams, the amount of electrons emitted from the emitter is adversely reduced.

DISCLOSURE OF THE INVENTION

The present invention is provided to solve the above-described problems. Objectives of this invention are as follows: (1) to obtain a field emission type electron source structure which achieves highly reliable operation required for next-generation displays; (2) to obtain a field emission type electron source structure which achieves high density and stable operation for high definition; and (3) to obtain a field emission type electron source structure having a beam convergence action which allows higher definition for a display application.

According to one aspect of the present invention, a field emission type electron source device includes a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electron source portion. The field emission electron source portion is provided in a drain region of the field effect transistor portion; and a control voltage is applied to a gate electrode of the field effect transistor portion to control a field emission current from the field emission electron source portion. The drain region includes at least two wells having different impurity concentrations. Of the at least two wells, one well having a low impurity concentration is provided at an end of the drain region which contacts a channel region of the field effect transistor portion.

For example, as the impurity elements the drain region may include at least two n-type impurity elements having different thermal diffusion speeds in the silicon substrate.

In one embodiment, as the impurity elements, the drain region includes phosphorous, having a fast thermal diffusion speed and arsenic, having a slow thermal diffusion speed in the silicon substrate.

According to another aspect of the present invention, a field emission type electron source device includes a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electron source portion. The field emission electron source portion is provided in a drain region of the field effect transistor portion. A control voltage is applied to a gate electrode of the field effect transistor portion to control a field emission current from the field emission electron source portion. The gate electrode of the field effect transistor portion has a shape including portions having at least two different gate widths; and a part of the gate electrode is provided in such a manner as to cover an end of the drain region.

According to further another aspect of the present invention, a field emission type electron source device includes a field emission electron source portion including an extraction electrode provided on a p-type silicon substrate via a first insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electron source portion. The field emission electron source portion is provided in a drain region of the field effect transistor portion; and a control voltage is applied to a gate electrode of the field effect transistor portion to control a field emission current from the field emission electron source portion. A gate insulating film is provided between the gate electrode of the field effect transistor and the p-type silicon substrate. The gate insulating film includes a film thinner than the first insulating film, the first insulating film being provided between the extraction electrode and the p-type silicon substrate. The gate insulating film is buried with the first insulating film.

The gate insulating film may include a thermally oxidized silicon film, provided by a step of thermal oxidization for sharpening treatment for sharpening a tip of the cathode portion of the field emission electron source portion.

According to still another aspect of the present invention, a field emission type electron source device includes a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electron source portion. The field emission electron source portion is provided in a drain region of the field effect transistor portion. A control voltage is applied to a gate electrode of the field effect transistor portion to control a field emission current from the field emission electron source portion. The field emission type electron source device further includes a shield electrode made of the same material of that of the gate electrode of the field effect transistor portion, and the shield electrode is provided in such a manner as to cover a channel region of the field effect transistor which is not covered with the gate electrode.

Preferably, the shield electrode is held at the same potential as that of the p-type silicon substrate, and the shield electrode has a function of blocking an external field, which is not caused by the gate electrode, from affecting the channel region.

According to still another aspect of the present invention, a field emission type electron source device includes a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electron source portion. The field emission electron source portion is provided in a drain region of the field effect transistor portion. A control voltage is applied to a gate electrode of the field effect transistor portion to control a field emission current from the field emission electron source portion. The drain region of the field effect transistor portion is provided in a source region of the field effect transistor portion in such a way to be surrounded by the source region. The gate electrode of the field effect transistor portion is positioned symmetrical in a plane with respect to the cathode of the field emission electron source portion.

For example, the drain region includes a p-type conductive layer.

An outer portion of the drain region may contact the channel region of the field effect transistor portion. The outer region of the drain region and an inner portion of the source region may have a shape of concentric circles.

At least a part of the gate electrode provided between the source region and the drain region may have a shape of a symmetrical circular arc.

For example, first voltage Vex applied to the extraction electrode of the field emission electron source portion and second voltage Vg applied to the gate electrode of the field effect transistor portion have a relationship such that Vg<Vex.

According to this invention, the drain end of the FET, into which high field intensity is concentrated, includes a well having a low impurity concentration. As a result, extreme concentration of fields can be relaxed. Therefore, reliability of device operation can be significantly improved.

At least two n-type impurity elements having different thermal diffusion speeds in the silicon substrate are used as impurity elements in the drain region, thereby easily obtaining at least two n-type wells utilizing the difference in thermal diffusion speed.

When phosphorous having a fast thermal diffusion speed and arsenic having a slow thermal diffusion speed are used as the impurity elements, an n-negative well having a low impurity concentration and an n-positive well having a high impurity concentration can be easily provided.

According to this invention, in the field emission type electron source device, a part of the channel gate electrode covers the drain end region, thereby allowing a drain current flowing from, the source to the drain to be diffused in the drain end region. As a result, current density can be reduced.

According to this invention, in the field emission type electron source device, the thick insulating film for the extraction electrode requiring a high level of applied voltage and an insulating film for the field effect transistor in which a thin insulating film is required for low-voltage drive can be separated in terms of function. Further, the gate insulating film is buried by an insulating film, thereby making it possible to provide multilayer wiring. Accordingly, wiring for matrix drive can be easily provided.

When the gate insulating film is made of a thermally oxidized silicon film provided by thermal oxidization for sharpening the tip of the cathode of the field emission electron source portion, a thermal oxidization film having a high-quality which is accurately controlled is obtained. Therefore, a high level of reliability can be obtained, and the control of the FET can be carried out in high precision.

Further, according to this invention, in the field emission type electron source device, when the channel region of the field effect transistor portion is covered with the shield electrode, influences of an external field can be blocked. When the shield electrode is made of the same material as that of the gate electrode, a wiring step is simplified.

When an additional structure is provided such that the shield electrode is held at the same potential as that of the p-type silicon substrate so that influences of external fields other than that of the gate electrode can be blocked, the shield electrode is held at the same potential as that of the p-type silicon substrate so that the shield function against the external field can be secured.

According to this invention, in the field emission type electron source device, electrodes such as the gate electrode can be symmetrical in a plane with respect to the center of the drain, thereby easily obtaining convergence of electrons.

Furthermore, according to this invention, the step of doping an impurity into the drain region by ion injection can be simplified, thereby reducing manufacturing cost and preventing variation in a shape of the cathode due to the injection of ions to the cathode.

The outer portion of the drain and the inner portion of the source, both contacting the channel region of the field effect transistor portion, have a shape of a concentric circle. Therefore, uniform injection of carriers from the source region to the drain region can be obtained, thereby achieving a satisfactory characteristic of a transistor.

At least a part of the gate electrode, which is used to control the channel region, is provided between the source region and the drain region and has a shape of a symmetrical circular arc. Therefore, the shape of the electrode for convergence is symmetrical around the drain, thereby obtaining more uniform convergence.

The first voltage (Vex) applied to the extraction electrode of the field emission electron source portion and the second voltage (Vg) applied to the gate electrode of the field effect transistor portion have a relationship such that Vg<Vex. Therefore, convergence of electrons can be secured.

BRIEF DESCRIPTION OF THE DRAWINGS

FIG. 1(a) is a cross-sectional view taken along line I—I of FIG. 1(b).

FIG. 2(a) is a cross-sectional view taken along line I—I of FIG. 2(b).

FIG. 4(a) is a cross-sectional view taken along line I—I of FIG. 4(b).

FIG. 5(a) is a cross-sectional view taken along line I—I of FIG. 5(b).

FIG. 6(a) is a cross-sectional view taken along line I—I of FIG. 6(b).

FIG. 7(a) is a cross-sectional view taken along line I—I of FIG. 7(b).

BEST MODE FOR CARRYING OUT THE INVENTION

Before embodiments of the present invention are specifically described, we discuss the results of a study by the inventor which is directed to problems with the conventional field emission type electron source device. It should be noted that the problems with the conventional technology described below is not conventionally recognized in the art.

Initially, a first problem with the conventional example will be described.

Figure 8:
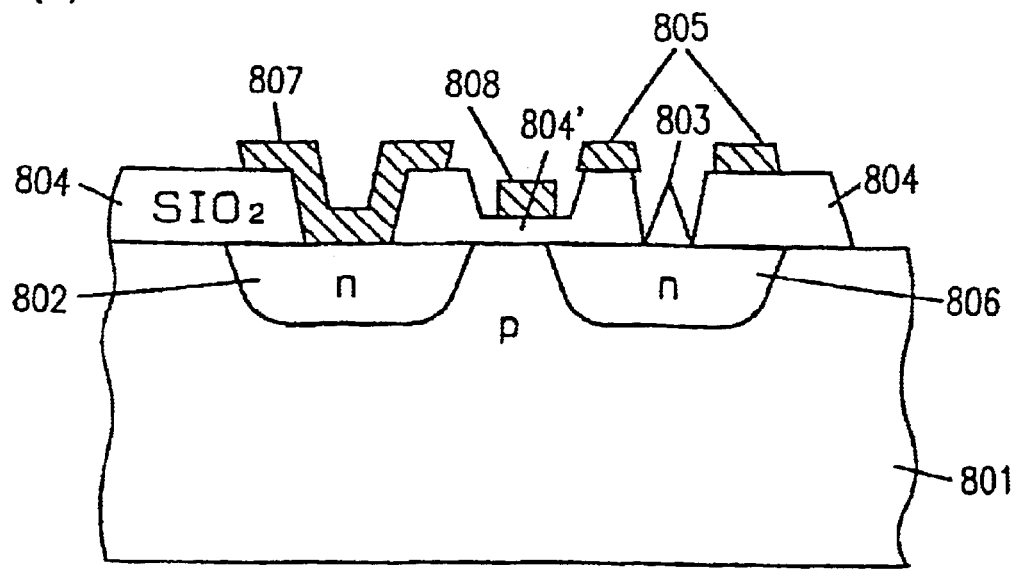
FIG. 8(a) is a cross-sectional view diagrammatically illustrating a configuration of a conventional field emission type electron source device.
FIG. 8(b) is an equivalent circuit diagram to a structure of 8(a).
Figure 8:
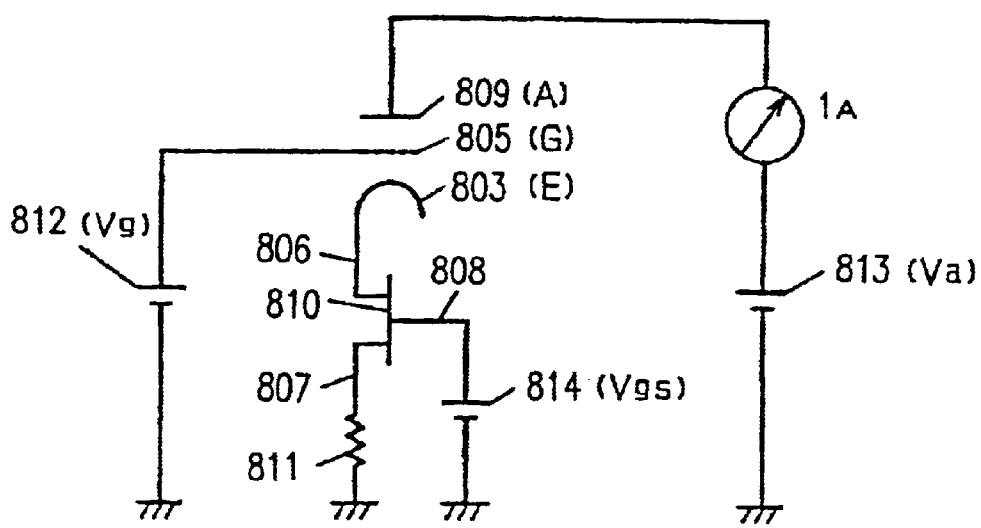
Figure 9:
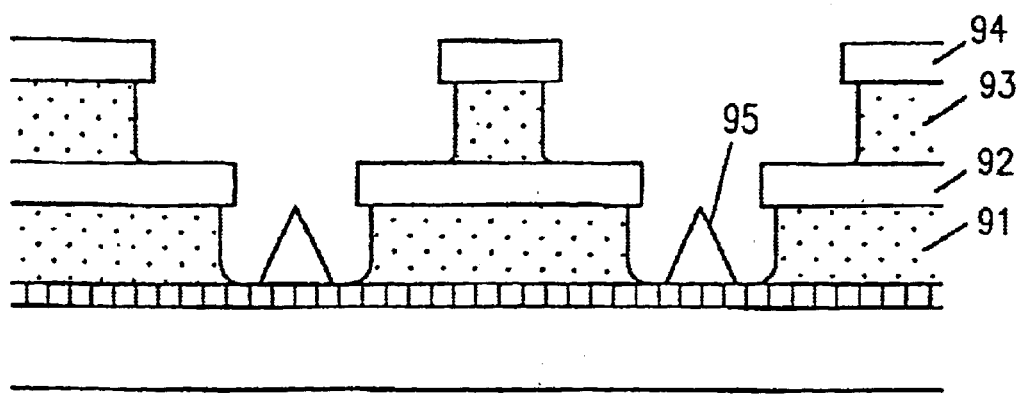
FIG. 9 is a cross-sectional view diagrammatically illustrating a configuration of a conventional field emission type electron source device.

In the structure shown in FIG. 8(a), while the gate-to-source control voltage Vgs is appropriately applied to the gate 808, i.e., the channel gate of the FET is opened, the gate voltage Vg is applied to the gate 805. In this case, the gate voltage Vg of a given level or more causes generation of field emission from a tip of the emitter. Field emission electrons flow from the emitter tip to the anode 509. At this point, since the channel resistance of the FET is sufficiently high, the potential of the drain is increased depending on amount of the field emission current.

This drain potential mainly depends on the product of the channel resistance which is a design parameter of the FET and the field emission current which is an operating condition. The field emission current is set depending on the desired brightness of an FED panel. Typically, the amount is set to around 1 μA per pixel. Further, when it is assumed that elements in a typical FET having a power source voltage of around 3.5 V have micro dimensions of the order of microns, the drain potential is increased to several volts or more, which has been experimentally demonstrated. To design a FET having a low operating voltage, a higher channel resistance is required. To increase the brightness, an increased field emission electron flow amount is required. These things further increase the drain potential.

The study by the inventors has demonstrated that the increased drain potential as described above causes several problems with the operation of the field emission type electron source device. Among the problems is the hot electron phenomenon.

When the FET is operated for a long time under a condition that the potential between the source and the drain exceeds a silicon bandgap energy of 1.1 eV, there occurs a phenomenon such that electrons accelerated by a field between the source and the drain are injected into a gate insulating film interface in the vicinity of the drain. The injected electrons remain in the vicinity of the gate insulating film, causing an action which cancels the gate voltage, or creating an interface level in the gate insulating film interface which generates a leak current via the gate insulating film. Thus, the injected electrons causes a variety of degradation of the FET performance.

Furthermore, the inventors have found that the impact ionization phenomenon is a factor which causes a change in a characteristic of the FET.

In other words, when the source-to-drain potential is an extremely high level of 10 V or more by applying a voltage to the extraction electrode, highly accelerated electrons have great kinetic energy in an average free path. When the electrons having such great kinetic energy are scattered, a pair of a hole and an electron are generated. Carriers thus generated in turn generate new carriers one after another. This is called as "avalanche multiplication phenomenon" which causes an extremely great change (increase) in current. This may eventually lead to destruction of the FET.

The above-described degradation of the characteristics of the FET due to the hot electrons, the above-described FET characteristic change and element destruction, and the like due to the impact ionization are significant failures to prevent a long-term reliable operation of a device. These are significant problems in an attempt to obtain low-voltage operation and an increased scale of integration.

On the other hand, there exists a phenomenon in the vicinity of a FET element such that the characteristics of the FET are changed by influence of a high level of external field.

To generate field emission from the emitter tip of the field emission cathode element, the gate voltage Vg of several tens of volts or more typically needs to be applied to the gate. In this case, FET elements corresponding to the field emission cathode elements may be integrated in high density so as to achieve a display having a high definition. This causes the gate and the channel portion of the FET to be close to each other, so that a field by a high gate voltage is likely to affect the channel portion of the FET. In this case, the channel resistance is apparently decreased due to the above-described external field. This causes an increase in the field emission electron flow amount which is initially stably controlled by the source-to-gate voltage Vsg of the FET. The higher the gate voltage Vg and the lower the source-to-gate voltage Vgs and the higher the packing density of elements, the further the risk of being affected by the external field. The adverse increase of the field emission electron flow amount due to the external field is also a factor of interfering with stable control for a emission current, and is therefore an obstacle to an attempt for practical use.

Next, problems with the second conventional example will be described.

When a negative potential relative to the first gate electrode 92 is applied to the second gate electrode 94, this negative potential acts on not only electrons emitted from the emitter but also an extraction field of the emitter tip. In the case where the emitter has an extraction electrode having an aperture diameter of about 1 μm, a typical potential of around 60 V needs to be applied to the first gate electrode 92 in order to obtain sufficient field emission.

To enhance the electron beam convergence effect, a relatively low negative potential needs to be applied to the second gate electrode 94. It has been experimentally demonstrated that an applied voltage of around 10 V allows sufficient convergence. However, the inventors have found that under such a convergence condition the amount of electrons simultaneously emitted from the emitter is decreased by a factor of several-fold.

As described above, in the structure of the second conventional example, the potential applied to the second gate electrode 94 cancels the strength of the field of the emitter tip which is generated by the first gate electrode 92. As a result, the field intensity is weakened and the electron emission amount is reduced. The structure of the conventional example has a trade-off between the convergence and the electron emission amount. It has been found that there is an essential problem that sufficient convergence is not carried out while maintaining a sufficient electron emission amount.

Hereinafter, several concrete embodiments of the present invention which have been achieved in view of the above-described study results on the conventional technology will be described with reference to the accompanying drawings.

EXAMPLE 1

Figure 1:
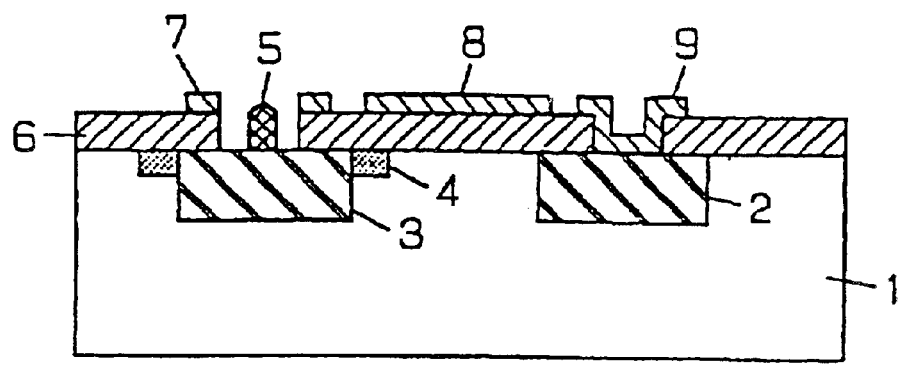
FIGS. 1(a) and 1(b) are cross-sectional and plan views diagrammatically illustrating a configuration of a field emission type electron source device according to Example 1 of the present invention respectively.
Figure 1:
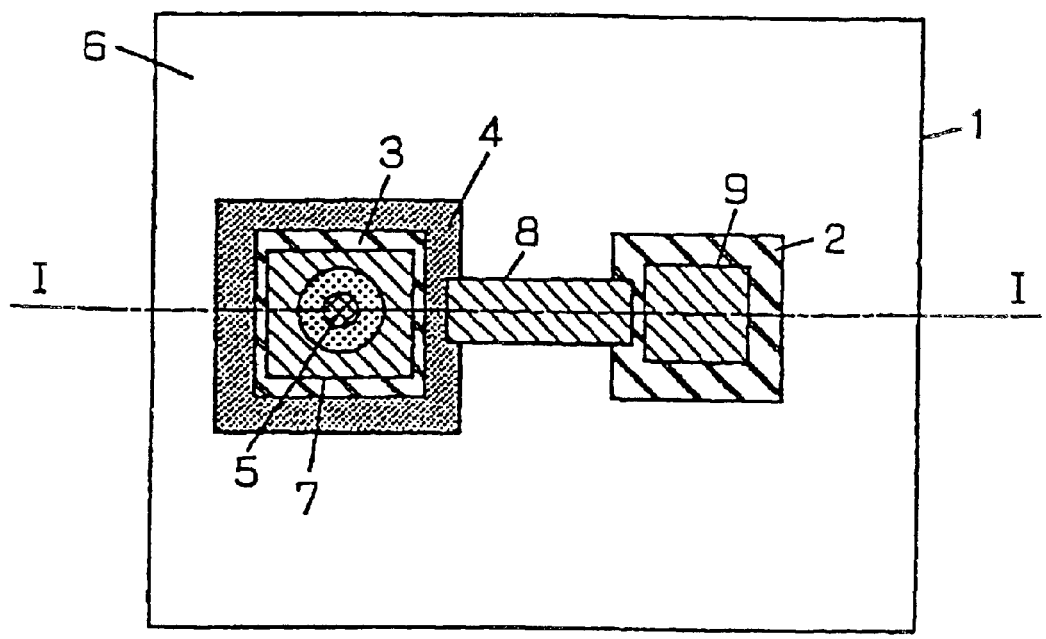

Hereinafter, a structure of a field emission type electron source device according to Example 1 of this invention will be described with reference to FIGS. 1(a) and 1(b). FIGS. 1(a) and 1(b) are cross-sectional and plan views of the field emission type electron source device of this example, respectively. FIG. 1(a) shows a cross-sectional structure shown in FIG. 1(b) taken along line I—I.

In the structure of this example, reference numeral 1 denotes a p-type silicon substrate; 2, a first n-type semiconductor conductive portion which is a source region of an element operating as a field effect transistor (FET); 3, a second n-type semiconductor conductive portion with a high impurity concentration which is a drain region of the FET; 4, a third n-type semiconductor conductive portion with a low impurity concentration which is a drain region of the FET; 5, a cathode operating as a field emission type electron source having a shape of a tower which is circular in cross section; 6, an insulating layer of silicon oxide film which functions as a gate insulating film of the field emission type electron source and the FET; 7, an extraction electrode for operation of the field emission type electron source; 8, a gate electrode for controlling the channel region of the FET; and 9, a source electrode for the FET.

As shown in FIGS. 1(a) and 1(b), in the field emission type electron source device of this example, the first n-type semiconductor conductive portion 2, serving as a source of the FET and the second n-type semiconductor conductive portion 3, serving as a drain, are formed at a given distance from each other on a part of one major surface of the p-type silicon substrate 1. Further, the third n-type semiconductor conductive portion 4, having a low impurity concentration, is selectively formed at a position such that the portion 4 surrounds the circumference of the second n-type semiconductor conductive portion 3.

In this case, phosphorus, which has a fast rate of thermal diffusion in a silicon substrate, is used as an n-type impurity element for forming the second n-type semiconductor conductive portion 3. Arsenic, which has a slow rate of thermal diffusion in a silicon substrate, is used as an n-type impurity element for forming the third n-type semiconductor conductive portion 4. This allows formation of the above-described well structure having different impurity concentrations in a self-aligned, simple and accurate manner. Here a principle in which impurity profile varies due to a difference between thermal diffusion rates is applied to a process where two or more different element ions are optimally injected using the same mask before thermal treatment. In other words, an element having a fast thermal diffusion rate (phosphorous etc.) is redistributed more deeply and more widely from an impurity profile which is originally formed by the injection than an element having a slow thermal diffusion rate (arsenic etc.).

The cathode 5 having a shape of a tower which is circular in cross section is formed on a surface of the second n-type semiconductor conductive portion 3 which is a drain. A tip portion of the tower-shaped cathode 5 of silicon has a micro tip structure portion being on the order of nanometers which is formed with a sharpening process using thermal oxidization. The conductive extraction electrode 7 is formed close to the cathode 5 via the insulating film 6 made of silicon oxide film which has a circular opening. The gate electrode 8 for the FET is formed on the insulating film 6 and in a channel region which is positioned between the first n-type semiconductor conductive portion 2 serving as a source and the second and third n-type semiconductor conductive portions 3 and 4 serving as a drain. Further, the source electrode 9 is formed via a contact window on the n-type semiconductor conductive portion 2 which is a source.

The operation of the field emission type electron source device of this example having the above-described structure will be described below.

The p-type silicon substrate 1 and the first n-type semiconductor conductive portion 2 which is a source region are connected to the ground. A positive voltage Vex is applied to the extraction electrode 7. Further, a predetermined voltage Vg is applied to the gate electrode 8 of the FET, so that a channel region under the gate electrode 8 is opened. In this state, electron carriers are ready to be injected from the source toward the drain. In this state, the positive voltage Vex is applied to the extraction electrode 7. The field emission electron source has a gate aperture diameter of the order of submicrons and a cathode tip portion of the order of nanometers. In the field emission electron source, a typical applied voltage of several tens of volts causes electrons to start field emission from the tip of the cathode 5. The emitted electrons move toward an anode plate opposed to the p-type silicon substrate 1 while being accelerated. The anode plate is not shown in FIGS. 1(a) and 1(b).

In this case, the emission amount of the electron flow emitted from the cathode 5 is not controlled by the fixed gate voltage Vex applied to the extraction electrode 7, but is controlled by the variable gate-to-source control voltage Vg applied to the gate electrode 8 of the FET connected to the cathode 5. In other words, the FET is operated in a constant current region by appropriately determining the gate-to-source control voltage Vg applied to the gate electrode 8 thereof. Thus, the emission amount of the electron flow field-emitted from the cathode 5 is determined by a characteristic of the FET which is connected in series to the emitter and which has a function of supplying electrons, which are to be emitted, into the emitter. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission electron flow amount can be obtained.

Here, functions of the third n-type semiconductor conductive portion 4 will be described in detail.

A feature of the drain structure of this example is to adopt a plurality of drain-well structures (so-called twin-well structure) having two or more impurity concentrations. A field-emitted electron flow is provided basically from a source of the FET. Since a channel region between the source and the drain has a high resistance, the drain potential is increased according to this electron flow emission amount, i.e., channel current amount. In the case of a FET which is formed in a submicron process and operates at a power source voltage of around 3.5 V, assuming that the channel current is around one microampere, it has been experimentally found that the drain potential reaches several volts or more. Electrons which have been injected from the source are accelerated by a field in the channel generated by the drain potential, thereby being injected to the drain.

However, a uniform channel field is not generated in the channel region, but a channel field is concentrated in the vicinity of the drain and on a surface of the silicon substrate. As a result, electrons running in the channel are caused by a high level of field existing in the vicinity of the drain to acquire a high level of energy (hot electrons). The higher energy the hot electrons have, the greater the field intensity in the vicinity of the drain. The high-energy hot electrons are likely to cause various problems such as an increase in threshold voltage for performing an ON/OFF control of the FET or a decrease in drain current.

On the other hand, when the third n-type semiconductor conductive portion 4 is disposed at an end of the drain, it is possible to prevent degradation of the FET performance due to the above-described hot electrons.

Since the drain typically has a high impurity concentration, a pn junction at an end of the drain is almost abrupt junction. However, as described in this example, the n-type semiconductor conductive portion 4 having a low impurity concentration is provided around the n-type semiconductor conductive portion 3 having a high impurity concentration of the drain. This allows a gradual pn junction at the drain end, resulting in relaxation of the concentration of field at the drain end. This effect removes the factor that the hot electrons degrade the FET performance, securing extremely stable device operation for a long time. Device reliability is thus significantly improved.

Note that, in the description of this example, a tower shape is an example of the shape of the cathode 5. The same effects may be obtained with a conventional cone-type cathode shape. Although the p-type silicon substrate is processed to form the cathode 5 in this example, conventional metal material (having a high melting point, such as molybdenum and tungsten) or carbon material (diamond, graphite, diamond-like carbon etc.) may be used to obtain the same effects.

EXAMPLE 2

Hereinafter, a structure of a field emission type electron source device according to Example 2 of this invention will be described with reference to FIGS. 2(a) and 2(b). FIGS. 2(a) and 2(b) are cross-sectional and plan views of the field emission type electron source device of this example, respectively. FIG. 2(a) shows a cross-sectional structure shown in FIG. 2(b) taken along line I—I.

In the structure of this example, reference numeral 1 denotes a p-type silicon substrate; 2, a first n-type semiconductor conductive portion which is a source region of an element operating as a field effect transistor (FET); 3, a second n-type semiconductor conductive portion with a high impurity concentration which is a drain region of the FET; 4, a third n-type semiconductor conductive portion with a low impurity concentration which is a drain region of the FET; 5, a cathode operating as a field emission type electron source having a shape of a tower which is circular in cross section; 6, an insulating layer of silicon oxide film which functions as a gate insulating film of the field emission type electron source and the FET; 7, an extraction electrode for operation of the field emission type electron source; 8T, a T-shaped gate electrode for controlling the channel region of the FET; and 9, a source electrode for the FET.

As shown in FIGS. 2(a) and 2(b), in the field emission type electron source device of this example, the n-type semiconductor conductive portion 2 serving as a source of the FET and the second n-type semiconductor conductive portion 3 serving as a drain are formed on a part of one major surface of the p-type silicon substrate 1. Further, the third n-type semiconductor conductive portion 4 having a low impurity concentration is selectively formed at a position such that the portion 4 surrounds the circumference of the second n-type semiconductor conductive portion 3.

The cathode 5 having a shape of a tower which is circular in cross section is formed on a surface of the n-type semiconductor conductive portion 3 which is a drain. A tip portion of the tower-shaped cathode 5 of silicon has a micro tip structure portion being on the order of nanometers which is formed with a sharpening process using thermal oxidization. The conductive extraction electrode 7 is formed close to the cathode 5 via the insulating film 6 made of silicon oxide film which has a circular opening. The gate electrode 8T for the FET is formed on the insulating film 6 and in a channel region which is positioned between the n-type semiconductor conductive portion 2 serving as a source and the n-type semiconductor conductive portions 3 and 4 serving as a drain. As is different from a conventional gate electrode structure having a single width, this gate electrode 8T has a plurality (two or more) of gate widths (so-called T-shaped gate structure). A part of the gate electrode 8T is provided in such a manner as to cover a surface of the n-type semiconductor conductive portion 4 having a low impurity concentration positioned in the channel region of the FET and at the drain end. Further, the source electrode 9 is formed via a contact window on the n-type semiconductor conductive portion 2 which is a source.

The operation of the field emission type electron source device of this example having the above-described structure will be described below.

The p-type silicon substrate 1 and the n-type semiconductor conductive portion 2 which is a source are connected to the ground. A positive voltage Vex is applied to the extraction electrode 7. Further, a predetermined voltage Vg is applied to the gate electrode 8T of the FET, so that a channel region under the gate electrode 8T is opened. In this state, electron carriers are ready to be injected from the source toward the drain. In this state, the positive voltage Vex is applied to the extraction electrode 7. The field emission electron source has a gate aperture diameter of the order of submicrons and a cathode tip portion of the order of nanometers. In the field emission electron source, a typical applied voltage of several tens of volts causes electrons to start field emission from the tip of the cathode 5. The emitted electrons move toward an anode plate opposed to the p-type silicon substrate 1 while being accelerated. The anode plate is not shown in FIGS. 2(a) and 2(b).

In this case, the emission amount of the electron flow emitted from the cathode 5 is not controlled by the fixed gate voltage Vex applied to the extraction electrode 7, but is controlled by the variable gate-to-source control voltage Vg applied to the gate electrode 8T of the FET connected to the cathode 5. In other words, the FET is operated in a constant current region by appropriately determining the gate-to-source control voltage Vg applied to the gate electrode 8T thereof. Thus, the emission amount of the electron flow field-emitted from the cathode 5 is determined by a characteristic of the FET which is connected in series to the emitter and which has a function of supplying electrons, which are to be emitted, into the emitter. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission electron flow amount can be obtained.

Here, functions of the gate electrode 8T which has two or more different gate widths and which is provided in such a way as to cover the drain end region will be described in detail.

A field-emitted electron flow is provided basically from a source of the FET. Since a channel region between the source and the drain has a high resistance, the drain potential is increased according to this electron flow emission amount, i.e., channel current amount. In the case of a FET which is formed in a submicron process and operates at a power source voltage of around 3.5 V, assuming that the channel current is around one microampere, it has been experimentally found that the drain potential reaches several volts or more. Electrons which have been injected from the source are accelerated by a field in the channel generated by the drain potential, thereby being injected to the drain.

However, a uniform channel field is not generated in the channel region, but a channel field is concentrated in the vicinity of the drain and on a surface of the silicon substrate. As a result, electrons running in the channel are affected by a high level of field existing in the vicinity of the drain to acquire a high level of energy (hot electrons). The higher energy the hot electrons have, the greater the field intensity in the vicinity of the drain. The high-energy hot electrons are likely to cause various problems such as an increase in threshold voltage for performing an ON/OFF control of the FET or a decrease in drain current.

On the other hand, when the gate electrode 8T (so-called T-shaped gate structure) described in this example is provided in such a manner as to cover the drain end, it is possible to prevent the above-described hot electrons.

Figure 2:
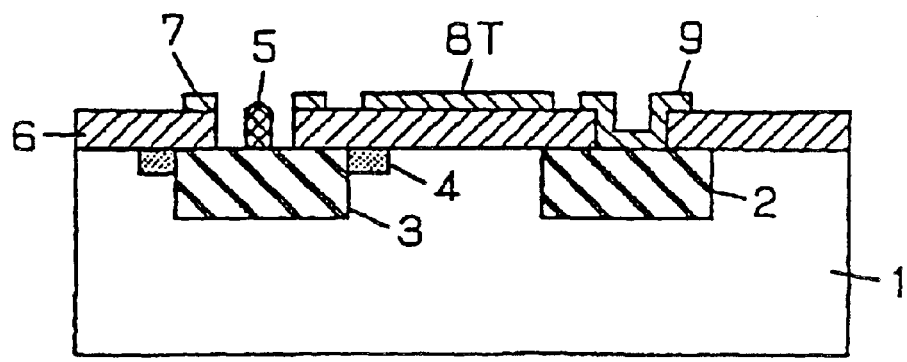
FIGS. 2(a) and 2(b) are cross-sectional and plan views diagrammatically illustrating a configuration of a field emission type electron source device according to Example 2 of the present invention, respectively.
Figure 2:
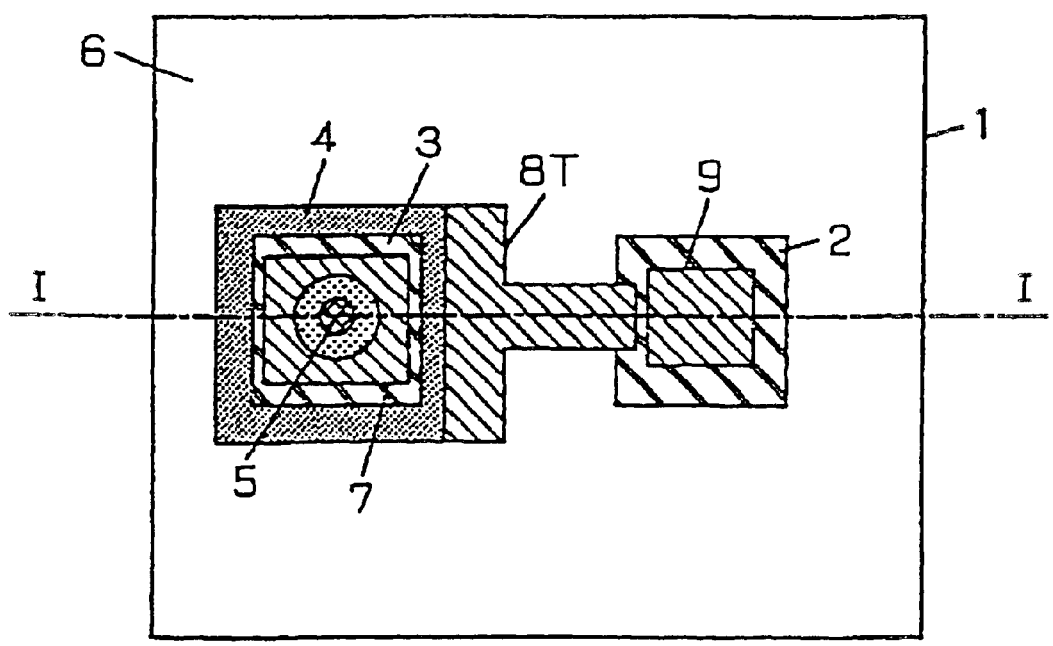

As shown in FIG. 2(*b*), one end of the gate electrode 8T is provided in such a manner as to cover the n-type semiconductor conductive portion 4 of the drain end region. For this reason,electrons injected from the source of the FET move along the channel formed under the gate electrode 8T. Therefore, an electron flow path is enlarged in the n-type conductive portion region described above. As a result, a drain current density is more significantly W reduced in the drain end region of the gate electrode 8T than in other regions. The hot electron phenomenon depends on the drain current density as well as field intensity. Accordingly, the above-described result leads to an effect such that degradation of the FET performance due to the hot electrons is significantly reduced.

Furthermore, the gate electrode structure having a plurality of gate widths (so-called T-shaped gate structure) described in this example has an effect in terms of the degree of freedom in design.

The amount of a drain current flowing through the channel of a FET is determined depending on a parameter (W/L) of the width (W) and length (L) of the gate electrode. The width of the drain is inevitably determined by the scale of integration and arrangement of the whole element. It is often difficult to arbitrarily design the width (W) of the gate electrode. However, the use of the T-shaped gate structure described in this example makes it possible to determine arbitrarily the element dimensions, i.e., width (W) and (L), using the remaining part of the gate after a part of the gate has been provided in such a manner as to cover the drain end region. For this reason, the degree of freedom for device design is improved.

This effect removes the factor that the hot electrons degrade the FET performance, securing the degree of freedom for element design. A stable device operation can be guaranteed in a very stable manner and over a long time. Device reliability is thus significantly improved.

Note that, in the description of this example, a tower shape is an example of the shape of the cathode 5. The same effects are obtained with a conventional cone-type cathode shape. Although the p-type silicon substrate is processed to form the cathode 5 in this example, a conventional metal material (having a high melting point, such as molybdenum and tungsten) or carbon material (diamond, graphite, diamond-like carbon etc.) may be used to obtain the same effects.

EXAMPLE 3

Figure 3:
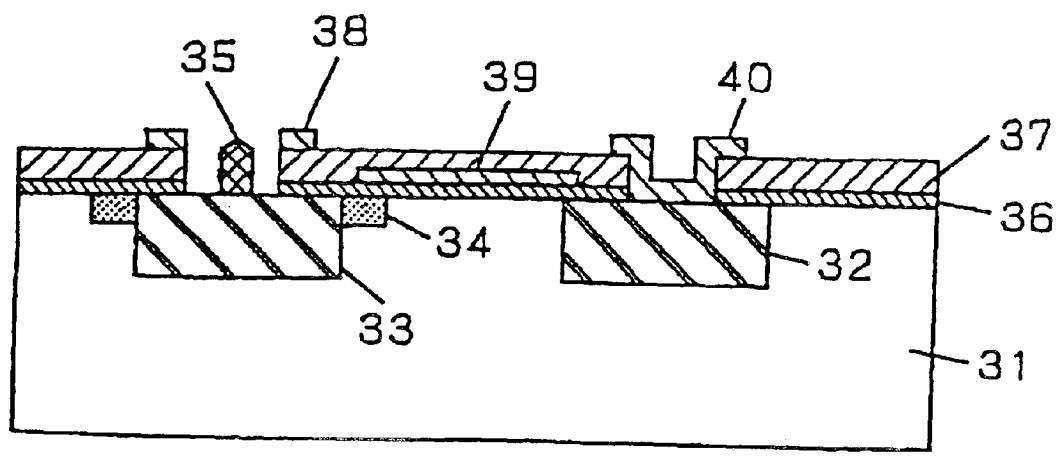
FIG. 3 is across-sectional view diagrammatically illustrating a configuration of a field emission type electron source device according to Example 3 of the present invention.

Hereinafter, a structure of a field emission type electron source device according to Example 3 of this invention will be described with reference to FIG. 3. FIG. 3 is a cross-sectional view of the field emission type electron source device of this example.

In the structure of this example, reference numeral 31 denotes a p-type silicon substrate; 32, a first n-type semiconductor conductive portion which is a source region of an element operating as a field effect transistor (FET); 33, a second n-type semiconductor conductive portion with a high impurity concentration which is a drain region of the FET; 34, a third n-type semiconductor conductive portion with a low impurity concentration which is a drain region of the FET; 35, a cathode operating as a field emission type electron source having a shape of a tower which is circular in cross section; 36, a lower insulating layer of silicon oxide film which functions as a gate insulating film of the PET; 37, an upper insulating layer of silicon oxide film which functions as an extraction electrode for the field emission type electron source; 38, an extraction electrode for operation of the field emission type electron source; 39, a gate electrode for controlling the channel region of the FET; and 40, a source electrode for the FET.

As shown in FIG. 3, in the field emission type electron source device of this example, the n-type semiconductor conductive portion 32, serving as a source of the FET, and the second n-type semiconductor conductive portion 33, serving as a drain, are formed on a part of one major surface of the p-type silicon substrate 31. Further, the third n-type semiconductor conductive portion 34, having a low impurity concentration, is selectively formed at a position such that the portion 34 surrounds the circumference of the second n-type semiconductor conductive portion 33.

The cathode 35, having a shape of a tower which is circular in cross section, is formed on a surface of the n-type semiconductor conductive portion 33 which is a drain. A tip portion of the tower-shaped cathode 35 of silicon has a micro tip structure portion being on the order of nanometers which is formed with a sharpening process using thermal oxidization. The conductive extraction electrode 38 is formed close to the cathode 35 via the lower and upper insulating films 36 and 37 made of silicon oxide film which has a circular opening. The gate electrode 39 for the FET is formed on the lower insulating film 36 in such a manner to be buried in the upper insulating film 37, and in a channel region which is positioned between the n-type semiconductor conductive portion 32 serving as a source and the n-type semiconductor conductive portions 33 and 34 serving as a drain. The lower insulating film 36 is made of the thermal oxidization film which has been formed in the sharpening process of the cathode 35. Further, the source electrode 40 is formed via a contact window on the n-type semiconductor conductive portion 32 which is a source.

The operation of the field emission type electron source device of this example having the above-described structure will be described below.

The p-type silicon substrate 31 and the first n-type semiconductor conductive portion 32 are connected to the ground. A positive voltage Vex is applied to the extraction electrode 38. Further, a predetermined voltage Vg is applied to the gate electrode 39 of the FET, so that a channel region under the gate electrode 39 is opened. In this state, electron carriers are ready to be injected from the source toward the drain. Preferably, the lower insulating film 36 has a good quality and is thin in order to reduce the threshold voltage of the FET.

In this state, the positive voltage Vex is applied to the extraction electrode 38. The field emission electron source has a gate aperture diameter of the order of submicrons and a cathode tip portion of the order of nanometers. In the field emission electron source, a typical applied voltage of several tens of volts causes electrons to start field emission from the tip of the cathode 35. The emitted electrons move toward an anode plate opposed to the p-type silicon substrate 31 while being accelerated. The anode plate is not shown in FIG. 3.

In this case, the emission amount of the electron flow emitted from the cathode 35 is not controlled by the fixed gate voltage Vex applied to the extraction electrode 38, but is controlled by the variable gate-to-source control voltage Vg applied to the gate electrode 39 of the FET connected to the cathode 35. In other words, the FET is operated in a constant current region by appropriately determining the gate-to-source control voltage Vg applied to the gate electrode 39 thereof. Thus, the emission amount of the electron flow field-emitted from the cathode 35 is determined by a characteristic of the FET which is connected in series to the emitter and which has a function of supplying electrons, which are to be emitted, into the emitter. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission electron flow amount can be obtained.

Here, functions of the gate electrode 39 which is buried between the lower and upper insulating films 36 and 37 will be described in detail.

The lower insulating film 36 of this example mainly functions as a gate insulating film for the FET. The threshold voltage for switching ON/OFF the FET significantly depends on the thickness of the gate insulating film. To operate at a lower voltage, the lower insulating film 36 needs to have a good quality and to be thin. On the other hand, a multilayer film of the lower and upper insulating film 36 and 37 is used for the extraction electrode 38 for the field emission type electron source. Since a high voltage of several tens of volts is typically applied to the extraction electrode 38, a thick insulating film is required for the extraction electrode 38 in view of voltage proof. When the ON/OFF control of the field emission type electron source is carried out by applying a voltage to the extraction electrode 38, a thick insulating film is more advantageous in terms of operating speed or power consumption.

Therefore, when a gate having the structure described in this example is used, a gate insulating film for a FET and an insulating film for a field emission type electron source are separately designed. This makes it easy to attempt to obtain a high-performance element.

Moreover, the gate electrode 39 is buried with the upper insulating film 37, thereby making it easy to obtain a multilayer wiring structure which is generally used for LSI. The use of multilayer wiring makes it easy to obtain a wiring structure for driving a matrix with x and y directions. The wiring structure cannot be obtained using monolayer wiring.

Note that, in the description of this example, a tower shape is an example of the shape of the cathode 35. The same effects are obtained with a conventional cone-type cathode shape. Although the p-type silicon substrate is processed to form the cathode 35 in this example, a conventional metal material (having a high melting point, such as molybdenum and tungsten) or carbon material (diamond, graphite, diamond-like carbon etc.) may be used to obtain the same effects.

EXAMPLE 4

Figure 4:
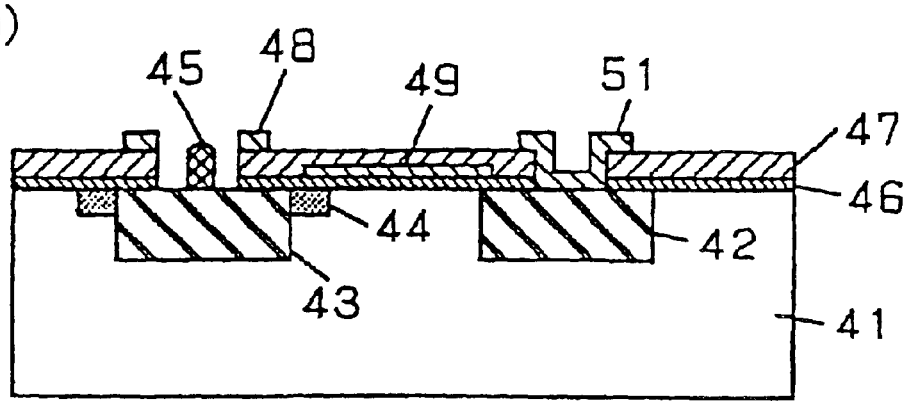
FIGS. 4(a) and 4(b) are cross-sectional and plan views diagrammatically illustrating a configuration of a field emission type electron source device according to Example 4 of the present invention, respectively.
Figure 4:
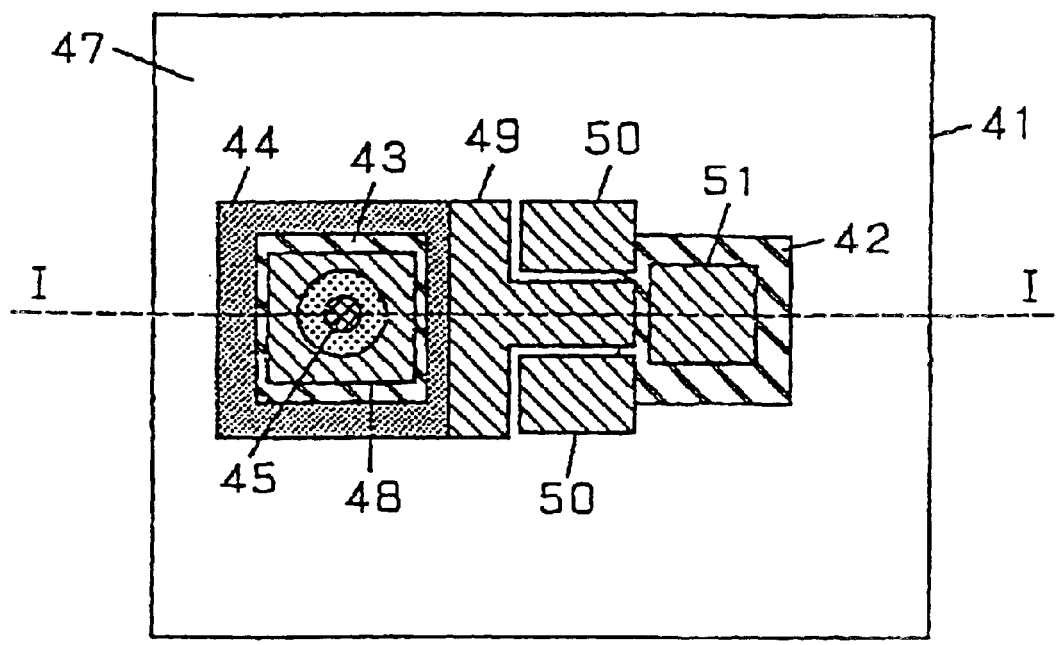

Hereinafter, a structure of a field emission type electron source device according to Example 4 of this invention will be described with reference to FIGS. 4(*a*) and 4(*b*). FIGS. 4(*a*) and 4(*b*) are cross-sectional and plan views of the field emission type electron source device of this example, respectively. FIG. 4(*a*) shows a cross-sectional structure shown in FIG. 4(*b*) taken along line I—I.

In the structure of this example, reference numeral 41 denotes a p-type silicon substrate; 42, a first n-type semiconductor conductive portion which is a source region of an element operating as a field effect transistor (FET); 43, a second n-type semiconductor conductive portion with a high impurity concentration which is a drain region of the FET; 44, a third n-type semiconductor conductive portion with a low impurity concentration which is a drain region of the FET; 45, a cathode operating as a field emission type electron source having a shape of a tower which is circular in cross section; 46, a lower insulating layer of silicon oxide film which functions as a gate insulating film of the FET; 47, an upper insulating layer of silicon oxide film which functions as an extraction electrode for the field emission type electron source; 48, an extraction electrode for operation of the field emission type electron source; 49, a gate electrode for controlling the channel region of the FET; 50, an electrode for shielding a channel region of the FET from an external field; and 51, a source electrode for the FET.

As shown in FIGS. 4(*a*) and 4(*b*), in the field emission type electron source device of this example, the n-type semiconductor conductive portion 42, serving as a source of the FET, and the n-type semiconductor conductive portion 43, serving as a drain, are formed on a part of one major surface of the p-type silicon substrate 41. Further, the n-type semiconductor conductive portion 44, having a low impurity concentration, is selectively formed at a position such that the portion 44 surrounds the circumference of the n-type semiconductor conductive portion 43. The cathode 45, having a shape of a tower which is circular in cross section, is formed on a surface of the n-type semiconductor conductive portion 43 which is a drain. A tip portion of the tower-shaped cathode 45 of silicon has a micro tip structure portion being on the order of nanometers which is formed with a sharpening process using thermal oxidization. The conductive extraction electrode 48 is formed close to the cathode 45 via the lower and upper insulating films 46 and 47 made of silicon oxide film which has a circular opening. The gate electrode 49 for the FET is formed on the lower insulating film 46 in such a manner to be buried in the upper insulating film 47, in a channel region which is positioned between the n-type semiconductor conductive portion 42 serving as a source and the n-type semiconductor conductive portions 43 and 44 serving as a drain. Further, the shield electrode 50 made of the same material as that of the gate electrode 49 is provided in such a manner as to cover the channel region of the FET in which the gate electrode 49 has not been formed. The lower insulating film 46 is made of the thermal oxidization film which has been formed in the sharpening process of the cathode 45. Further, the source electrode 51 is formed via a contact window on the n-type semiconductor conductive portion 42 which is a source.

The operation of the field emission type electron source device of this example having the above-described structure will be described below.

The p-type silicon substrate 41, the n-type semi-conductor conductive portion 42 which is a source, and the shield electrode 50 are connected to the ground. A positive voltage Vex is applied to the extraction electrode 48. Further, a predetermined voltage Vg is applied to the gate electrode 49 of the FET, so that a channel region under the gate electrode 49 is opened. In this state, electron carriers are ready to be injected from the source toward the drain. In this state, the positive voltage Vex is applied to the extraction electrode 48. The field emission electron source has a gate aperture diameter of the order of submicrons and a cathode tip portion of the order of nanometers. In the field emission electron source, a typical applied voltage of several tens of volts causes electrons to start field emission from the tip of the cathode 45. The emitted electrons move toward an anode plate opposed to the p-type silicon substrate 41 while being accelerated. The anode plate is not shown in the figures.

In this case, the emission amount of the electron flow emitted from the cathode 45 is not controlled by the fixed gate voltage Vex applied to the extraction electrode 48, but is controlled by the variable gate-to-source control voltage Vg applied to the gate electrode 49 of the FET connected to the cathode 45. In other words, the FET is operated in a constant current region by appropriately determining the gate-to-source control voltage Vg applied to the gate electrode 49 thereof. Thus, the emission amount of the electron flow field-emitted from the cathode 45 is determined by a characteristic of the FET which is connected in series to the emitter and which has a function of supplying electrons, which are to be emitted, into the emitter. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission electron flow amount can be obtained.

Here, functions of the shield electrode 50 will be described in detail.

When the above-described field emission type electron source is operated in predetermined vacuum atmosphere, electrons field emitted from the cathode 45 collide with gas molecules remaining in the vacuum atmosphere, thereby ionizing the molecules. This ionization depends on the degree of vacuum, the type and concentration of the remaining molecules, the intensity of an external field for accelerating electrons, the density of field-emitted electrons (emission current amount) and the like used in the operation. Of the generated ions, positively charged ions (positive ions) are guided toward the substrate by an applied field, i.e., a direction opposite to that of electrons. The silicon substrate 41 is irradiated by the positive ions. The element structure described in this example has a most-upper surface covered with the upper insulating film 47. When the upper insulating film 47 is continuously irradiated by the positive ions in a given density or more, the upper insulating film 47 is positively charged in a gradual manner, thereby generating a positively-charged voltage.

If the shield electrode 50 is not formed on a FET, the following problems arise.

When the charged voltage generated on an upper portion of the channel region of the FET by the ion irradiation z exceeds the operating voltage of the FET, misoperation is induced. In addition to the drain current normally controlled, an additional drain current flows due to the charge voltage, resulting in loss of the current control characteristic of the FET.

On the other hand, as described in this example, the channel region is covered with the shield electrode 50 having the same potential as that of the substrate. For this reason, even when the charge voltage is generated, the shield effect blocks influence of a field on the channel region, thereby preventing an change in a characteristic of the FET.

It is believed that an actual panel requires emission operation in vacuum atmosphere having a low level of $10^{-6}$ Torr. In this case, the above-described influence of the ion irradiation is likely to increase. Notwithstanding the use of the shield electrode prevents an change in a characteristic of the FET, thereby obtaining long-term stable emission operation. Device reliability is thus significantly improved.

Note that, in the description of this example, a tower shape is an example of the shape of the cathode 45. The same effects are obtained with a conventional cone-type cathode shape. Although the p-type silicon substrate is processed to form the cathode 45 in this example, a conventional metal material (having a high melting point, such as molybdenum and tungsten) or carbon material (diamond, graphite, diamond-like carbon etc.) may be used to obtain the same effects.

EXAMPLE 5

Hereinafter, a structure of a field emission type electron source device according to Example 5 of this invention will be described with reference to FIGS. 5(a) and 5(b). FIGS. 5(a) and 5(b) are cross-sectional and plan views of the field emission type electron source device of this example, respectively. FIG. 5(a) shows a cross-sectional structure shown in FIG. 5(b) taken along line I—I.

In the structure of this example, reference numeral 51 denotes a p-type silicon substrate; 52, a first n-type semiconductor conductive portion which is a source region of an element operating as a field effect transistor (FET); 53, a second n-type semiconductor conductive portion with a high impurity concentration which is a drain region of the FET; 54, a cathode operating as a field emission type electron source having a shape of a tower which is circular in cross section; 55, a first insulating layer of silicon oxide film which mainly functions as a gate insulating film of the FET; 56, a second insulating layer of silicon oxide film which mainly functions as an insulating film for an extraction electrode for the field emission type electron source; 57, a gate electrode for controlling the channel region of the FET; 58, a source electrode for the FET; and 59, an extraction electrode for the cathode.

Figure 5:
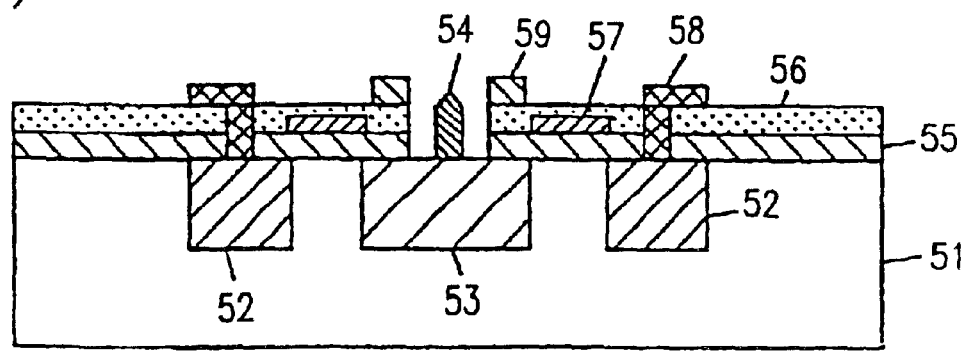
FIGS. 5(a) and 5(b) are cross-sectional and plan views diagrammatically illustrating a configuration of a field emission type electron source device according to Example 5 of the present invention, respectively.
Figure 5:
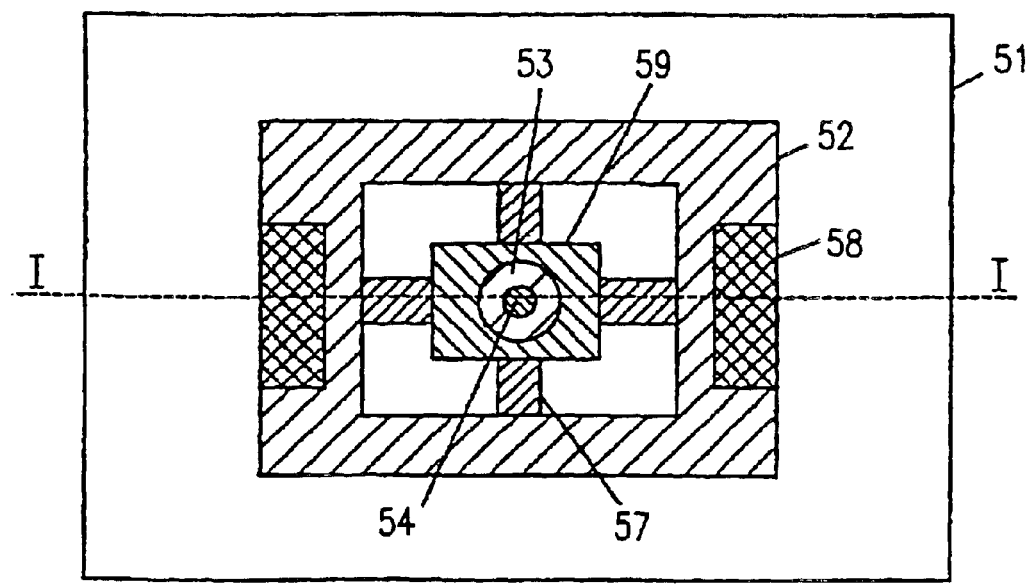

As shown in FIGS. 5(*a*) and 5(*b*), in the field emission type electron source device of this example, the first n-type semiconductor conductive portion 52, serving as a source of the FET, and the second n-type semiconductor conductive portion 53, serving as a drain, are formed on a part of one major surface of the p-type silicon substrate 51. The second n-type semiconductor conductive portion 53 is formed in such a manner the first n-type semiconductor conductive portion 52 surrounds the circumference of the second n-type semiconductor conductive portion 53.

Further, the gate electrode 57 is buried between the first insulating layer 55 and the second insulating layer 56, and is provided above at least a part of a surface of the channel region of the FET positioned between the first n-type semiconductor conductive portion 52 serving as a source and the second n-type semiconductor conductive portion 53 serving as a drain. Further, the source electrode 58 is formed via a contact window on the first n-type semiconductor conductive portion 52.

The cathode 54 having a shape of a tower which is circular in cross section is formed on a surface of the second n-type semiconductor conductive portion 53 which is a drain. A tip portion of the tower-shaped cathode 54 of silicon has a micro tip structure portion being on the order of nanometers which is formed with a sharpening process using thermal oxidization. The extraction electrode 59 having a given opening diameter is provided around the cathode 54 and on the second insulating layer 56 for applying a field for electron emission.

The operation of the field emission type electron source device of this example having the above-described structure will be described below.

The p-type silicon substrate 51 and the first n-type semiconductor conductive portion 52 which is a source are connected to the ground. A positive voltage Vex is applied to the extraction electrode 59. Further, a predetermined voltage Vg is applied to the gate electrode 57 of the FET, so that a channel region under the gate electrode 57 is opened. In this state, electron carriers are ready to be injected from the source toward the drain. In this state, the positive voltage Vex is applied to the extraction electrode 59. Here Vex and Vg are set to satisfy Vg<Vex. The field emission electron source has a gate opening diameter of the order of submicrons and a cathode tip portion of the order of nanometers. In the field emission electron source, a typical applied voltage of several tens of volts causes electrons to start field emission from the tip of the cathode 54. The emitted electrons move toward an anode plate opposed to the p-type silicon substrate 51 while being accelerated. The anode plate is not shown in the figures.

In this case, the emission amount of the electron flow emitted from the cathode 54 is not controlled by the fixed gate voltage Vex applied to the extraction electrode 59, but is controlled by the variable gate-to-source control voltage Vg applied to the gate electrode 57 of the FET connected to the cathode 54. In other words, the FET is operated in a constant current region by appropriately determining the gate-to-source control voltage Vg applied to the gate electrode 57 thereof. Thus, the emission amount of the electron flow field-emitted from the cathode 54 is determined by a characteristic of the FET which is connected in series to the emitter and which has a function of supplying electrons, which are to be emitted, into the emitter. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission electron flow amount can be obtained.

Here, arrangement of the source and drain which are features of this example will be described in detail.

A feature of the drain structure of this example is an island structure where the outer portion thereof is surrounded by the source region and the channel region. Further, the gate electrode, which controls the operation of the FET, is provided symmetrically around the cathode of the field emission electron source portion. The use of this arrangement allows uniform injection of carriers from the source region into the drain region.

As to a drain in a typical structure, carriers are injected into the drain via part of the boundary thereof, the part contacting with the channel region. In this case, the injected carriers are diffused in the drain and reach the cathode of the field emission electron source portion. Therefore, the concentration of the carriers is likely to vary depending on the position of the drain. On the other hand, such a problem does not arise in the above-described structure of this example.

In the foregoing, a single cathode is formed in the drain. Typically, several hundreds of cathodes are formed in the drain per pixel (multi-emitter structure) when the field emission electron source is used for pixels of an FED. When the carrier density varies in the drain, the amount of electrons emitted from the cathode is likely to vary depending on the position of the cathode. In this invention, carriers are injected uniformly and symmetrically through the gate electrode provided symmetrically with respect to the drain in which the cathode is formed, thereby preventing variation in electron emission in the drain.

Further, the extraction electrode of this invention effectively controls the beam path of emitted electrons as well as the electron emission amount.

A relationship between voltage Vg applied to the gate electrode of the FET and extraction voltage Vex for operating the cathode is predetermined to an optimal condition while satisfying Vg<Vex. Accordingly, emitted electrons are affected by a field of Vg in vacuum and are then converged. This is because the potential of Vg which is lower than Vex generates a field which causes convergence of electrons moving from the cathode toward an anode opposed to the cathode. In particular, the gate electrode provided symmetrically with respect to the cathode generates a convergence field symmetrical with respect to the electron path, thereby obtaining a satisfactory lens action which is not available in the conventional example.

The gate electrode 57 causing the convergence action is provided as a wire buried between the first insulating layer 55 and the second insulating layer 56, and is positioned lower than the extraction electrode 59. Because of this relative arrangement, even when voltage Vg that is relatively lower than voltage Vex is applied, the cathode 54 is not affected by the gate electrode 57.

In the conventional structure, an improved convergence function leads to a decreased electron emission amount. The structure of this invention can provide sufficient convergence while keeping an electron emission amount.

As described above, in the structure of this example, variation in electron emission in a drain is prevented, and the symmetrically disposed gate electrode allows beam convergence. Therefore, extremely stable emitter operation having a small beam spread, i.e., high density, can be guaranteed. It is thus believed that this satisfactory field emission electron source is suitable for high definition display.

Note that, in the description of this example, a tower shape is an example of the shape of the cathode 54. The same effects are obtained with a conventional cone-type cathode shape. Although the p-type silicon substrate is processed to form the cathode 54 in this example, a conventional metal material (having a high melting point, such as molybdenum and tungsten) or carbon material (diamond, graphite, diamond-like carbon etc.) may be used to obtain the same effects.

EXAMPLE 6

Figure 6:
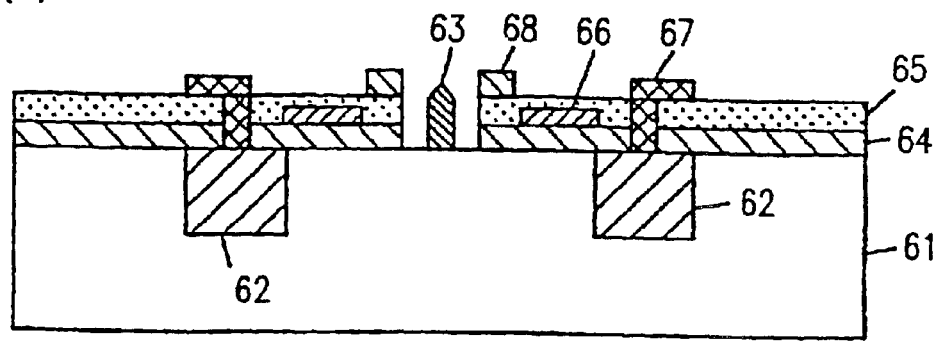
FIGS. 6(a) and 6(b) are cross-sectional and plan views diagrammatically illustrating a configuration of a field emission type electron source device according to Example 6 of the present invention, respectively.
Figure 6:
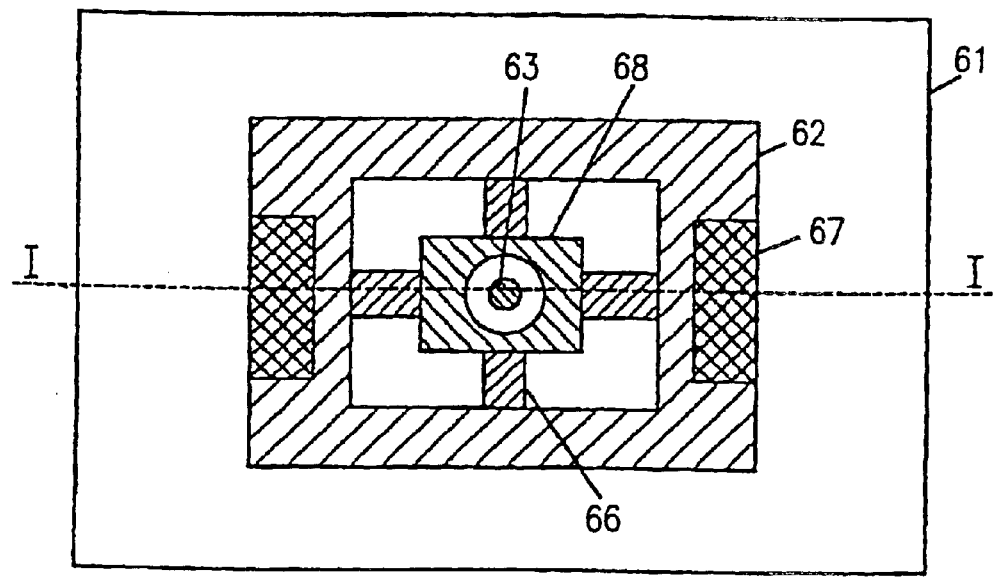

Hereinafter, a structure of a field emission type electron source device according to Example 6 of this invention will be described with reference to FIGS. 6(a) and 6(b). FIGS. 6(a) and 6(b) are cross-sectional and plan views of the field emission type electron source device of this example, respectively. FIG. 6(a) shows a cross-sectional structure shown in FIG. 6(b) taken along line I—I.

In the structure of this example, reference numeral 61 denotes a p-type silicon substrate; 62, an n-type semiconductor conductive portion which is a source region of an element operating as a field effect transistor (FET); 63, a cathode operating as a field emission type electron source having a shape of a tower which is circular in cross section; 64, a first insulating layer of silicon oxide film which mainly functions as a gate insulating film of the FET; 65, a second insulating layer of silicon oxide film which mainly functions as an insulating film for an extraction electrode for the field emission type electron source; 66, a gate electrode for controlling the channel region for FET; 67, a source electrode for the FET; and 68, an extraction electrode for the cathode.

As shown in FIGS. 6(a) and 6(b), in the field emission type electron source device of this example, a field emission electron source portion which includes the first n-type semiconductor conductive portion 62 serving as a source of the FET, the cathode 63 and the extraction electrode 68 are formed on a part of one major surface of the p-type silicon substrate 61. The field emission electron source portion is formed in such a manner the n-type semiconductor conductive portion 62 surrounds the circumference of the field emission electron source portion.

Further, the gate electrode 66 is provided above at least a part of a surface of the channel region of the FET positioned between the n-type semiconductor conductive portion 62 serving as a source and the field emission electron source. The gate electrode 66 is formed as a wire which is buried between the first and second insulating layers 64 and 65. The gate electrode 66 is symmetrical with respect to the cathode 63. The gate electrode 66 controls a current via the first insulating layer 64. Further, the source electrode 67 is formed via a contact window on the n-type semiconductor conductive portion 62 which is a source.

The cathode 63, having a shape of a tower which is circular in cross section, is formed on a surface of the silicon substrate 61, which is a drain region, inside the n-type semiconductor conductive portion 62, which is a source. A tip portion of the tower-shaped cathode 63 of silicon has a micro tip structure portion being on the order of nanometers which is formed with a sharpening process using thermal oxidization. The extraction electrode 68 having a given opening diameter is provided around the cathode 63 and on the second insulating layer 65 for applying a field for electron emission.

The operation of the field emission type electron source device of this example having the above-described structure will be described below.

The p-type silicon substrate 61 and the n-type semiconductor conductive portion 62, which is a source, are connected to the ground. A positive voltage Vex is applied to the extraction electrode 68. Further, a predetermined voltage Vg is applied to the gate electrode 66 of the FET, so that a channel region under the gate electrode 66 is opened. In this state, electron carriers are ready to be injected from the source toward the drain. In this state, the positive voltage Vex is applied to the extraction electrode 68. Here Vex and Vg are set to satisfy Vg<Vex. The positive voltage applied to the extraction electrode forms a depletion layer in a surface portion of the p-type silicon substrate under the extraction electrode. When voltage Vg is sufficiently high, an n-type inversion layer is formed in a surface of the depletion layer, which functions as a conduction layer for electron carriers. As a result, electrons injected from the channel region are guided in a emitter direction via the formed n-type inversion layer. As a result, a given applied voltage Vex allows a similar transistor operation even when the n-type semiconductor conductive portion is not formed in the drain.

The field emission electron source has a given gate aperture diameter of the order of submicrons and a cathode tip portion of the order of nanometers. In the field emission electron source, a typical applied voltage of several tens of volts causes electrons to start field emission from the tip of the cathode 63. The emitted electrons move toward an anode plate opposed to the p-type silicon substrate 61 while being accelerated. The anode plate is not shown in the figures.

In this case, the emission amount of the electron flow emitted from the cathode 63 is not controlled by the fixed gate voltage Vex applied to the extraction electrode 68, but is controlled by the variable gate-to-source control voltage Vg applied to the gate electrode 66 of the FET connected to the cathode 63. In other words, the FET is operated in a constant current region by appropriately determining the gate-to-source control voltage Vg applied to the gate electrode 66 thereof. Thus, the emission amount of the electron flow field-emitted from the cathode 63 is determined by a characteristic of the FET which is connected in series to the emitter and which has a function of supplying electrons, which are to be emitted, into the emitter. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission electron flow amount can be obtained. Here, arrangement of the source and drain which are features of this example will be described in detail.

A feature of the field emission electron source portion of this example is an island structure where the outer portion thereof is surrounded by the source region and the channel region. Further, the gate electrode which controls the operation of the FET is provided symmetrically around the cathode of the field emission electron source portion. The use of this arrangement allows uniform injection of carriers from the source region into the n-type inversion layer region generated under the extraction electrode. As to a drain in a typical structure, carriers are injected into the drain via part of the boundary thereof, the part contacting with the channel region. In this case, the injected carriers are diffused in the drain and reach the cathode of the field emission electron source portion. Therefore, the concentration of the carriers is likely to vary depending on the position of the drain. On the other hand, such a problem does not arise in the above-described structure of this example.

In the foregoing, a single cathode is formed in the n-type inversion layer region functioning as a drain. Typically, several hundreds of cathodes are formed in the drain per pixel (multi-emitter structure) when the field emission electron source is used for pixels of an FED.

When the carrier density varies in the drain, the amount of electrons emitted from the cathode is likely to vary depending on the position of the cathode. In this invention, carriers are injected uniformly and symmetrically through the gate electrode provided symmetrically with respect to the n-type inversion layer region in which the cathode is formed, thereby preventing variation in electron emission in the n-type inversion layer region.

Further, the extraction electrode of this invention effectively controls the beam path of emitted electrons as well as the electron emission amount. A relationship between voltage Vg applied to the gate electrode of the FET and extraction voltage Vex for operating the cathode is predetermined to an optimal condition while satisfying Vg<Vex. Accordingly, emitted electrons are affected by a field of Vg in vacuum and are then converged. This is because the potential of Vg which is lower than Vex generates a field which causes convergence of electrons moving from the cathode toward an anode opposed to the cathode. In particular, the gate electrode provided symmetrically with respect to the cathode generates a focus field which is symmetrical with respect the electron path, thereby obtaining a satisfactory lens action which is not available in the conventional example.

The gate electrode 66 causing the convergence action is provided as a wire buried between the first insulating layer 64 and the second insulating layer 65, and is positioned lower than the extraction electrode 68. Because of this relative arrangement, even when applied voltage Vg is relatively lower than voltage Vex, the cathode 63 is not affected by the gate electrode 66. In the conventional structure, an enhanced convergence function leads to a decrease in an electron emission amount. The structure of this invention can provide sufficient convergence while keeping an electron emission amount.

As described above, in the structure of this example, variation in electron emission in the n-type inversion region functioning as a drain is prevented, and the symmetrically disposed gate electrode allows beam convergence. Therefore, extremely stable emitter operation having a small beam spread, i.e., high density, can be quranteed. It is thus believed that this satisfactory field emission electron source is suitable for high definition display.

Note that, in the description of this example, a tower shape is an example of the shape of the cathode 63. The same effects are obtained with a conventional cone-type cathode shape. Although the p-type silicon substrate is processed to form the cathode 63 in this example, a conventional metal material (having a high melting point, such as molybdenum and tungsten) or carbon material (diamond, graphite, diamond-like carbon etc.) may be used to obtain the same effects.

EXAMPLE 7

Figure 7:
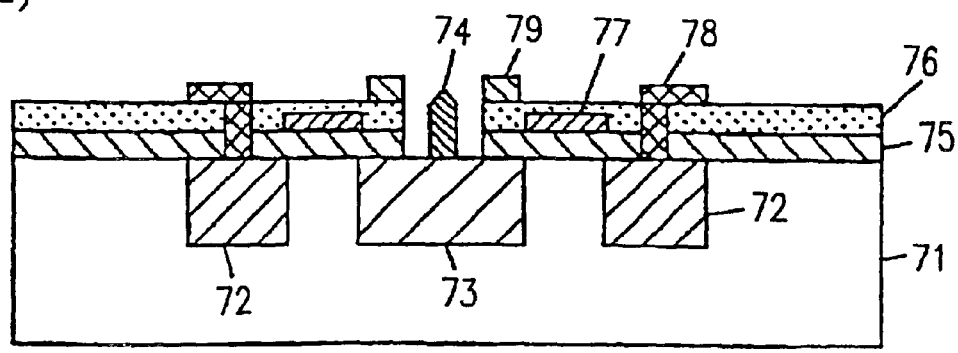
FIGS. 7(a) and 7(b) are cross-sectional and plan views diagrammatically illustrating a configuration of a field emission type electron source device according to Example 7 of the present invention, respectively.
Figure 7:
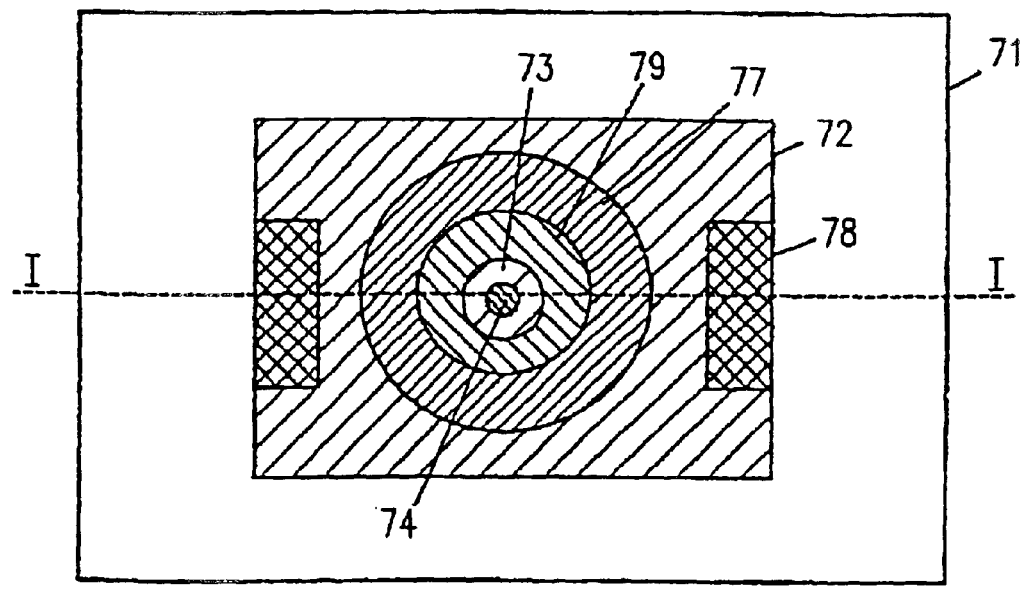

Hereinafter, a structure of a field emission type electron source device according to Example 7 of this invention will be described with reference to FIGS. 7(a) and 7(b). FIGS. 7(a) and 7(b) are cross-sectional and plan views of the field emission type electron source device of this example, respectively. FIG. 7(a) shows a cross-sectional structure shown in FIG. 7(b) taken along line I—I.

In the structure of this example, reference numeral 71 denotes a p-type silicon substrate; 72, a first n-type semiconductor conductive portion which is a source region of an element operating as a field effect transistor (FET); 73, a second n-type semiconductor conductive portion which is a drain region of the FET and has a high impurity concentration; 74, a cathode operating as a field emission type electron source having a shape of a tower which is circular in cross section; 75, a first insulating layer of silicon oxide film which mainly functions as a gate insulating film of the FET; 76, a second insulating layer of silicon oxide film which mainly functions as an insulating film for extraction electrode for the field emission type electron source; 77, a gate electrode for the FET to control a channel region; 78, a source electrode for the FET; and 79, an extraction electrode for the cathode.

As shown in FIGS. 7(a) and 7(b), in the field emission type electron source device of this example, the first n-type semiconductor conductive portion 72 serving as a source of the FET and the second n-type semiconductor conductive portion 73 serving as a drain, are formed on a part of one major surface of the p-type silicon substrate 71. The second n-type semiconductor conductive portion 73 is formed in such a manner that the first n-type semiconductor conductive portion 72 surrounds the circumference of the second n-type semiconductor conductive portion 73.

The inner portion of the first n-type semiconductor conductive portion 72, serving as a source, and the outer portion of the second n-type semiconductor conductive portion 73, serving as a drain, each have a shape of concentric circles. The channel region of the FET is positioned between the above-described source region and the above-described drain region. The channel region has a shape of a ring. The gate electrode 77 having a shape of a ring is buried between the first insulating layer 75 and the second insulating layer 76 in such a manner as to cover the ring-shaped channel.

The source electrode 78 is formed via a contact window on the n-type semiconductor conductive portion 72 which is a source.

The cathode 74, having a shape of a tower which is circular in cross section, is formed on a surface of the second n-type semiconductor conductive portion 73, which is a drain. A tip portion of the tower-shaped cathode 74 of silicon has a micro tip structure portion being on the order of nanometers which is formed with a sharpening process using thermal oxidization. The extraction electrode 79, having a given opening diameter, is provided around the cathode 74 and on the second insulating layer 76 for applying a field for electron emission.

The operation of the field emission type electron source device of this example having the above-described structure will be described below.

The p-type silicon substrate 71 and the first n-type semiconductor conductive portion 72 which is a source region are connected to the ground. A positive voltage Vex is applied to the extraction electrode 79. Further, a predetermined voltage Vg is applied to the gate electrode 77 of the FET, so that a channel region under the gate electrode 77 is opened. In this state, electron carriers are ready to be injected from the source toward the drain. In this state, the positive voltage Vex is applied to the extraction electrode 79.

Here Vex and Vg are set to satisfy Vg<Vex. The field emission electron source has a gate aperture diameter of the order of submicrons and a cathode tip portion of the order of nanometers. In the field emission electron source, a typical applied voltage of several tens of volts causes electrons to start field emission from the tip of the cathode 74. The emitted electrons move toward an anode plate opposed to the p-type silicon substrate 71 while being accelerated. The anode plate is not shown in the figures.

In this case, the emission amount of the electron flow emitted from the cathode 74 is not controlled by the fixed gate voltage Vex applied to the extraction electrode 79, but is controlled by the variable gate-to-source control voltage Vg applied to the gate electrode 77 of the FET connected to the cathode 74. In other words, the FET is operated in a constant current region by appropriately determining the gate-to-source control voltage Vg applied to the gate electrode 77 thereof. Thus, the emission amount of the electron flow field-emitted from the cathode 74 is determined by a characteristic of the FET which is connected in series to the emitter and which has a function of supplying electrons, which are to be emitted, into the emitter. Therefore, optimization of the FET design allows predetermination of the operating conditions and field emission electron flow amount of the FET. In particular, when the field emission is performed in the saturated operating region of the FET, the field emission is free from factors of instability of the emitter itself. As a result, an extremely stable and accurately controlled field emission electron flow amount can be obtained.

Here, arrangement of the ring-shaped gate electrode 77, which is a feature of this example, will be described in detail.

A feature of the drain structure of this example is an island structure where the outer portion thereof is surrounded by the source region and the channel region. Further, the gate electrode which controls the operation of the FET is provided in a shape of a ring symmetrically around the cathode of the field emission electron source portion. The use of this arrangement allows uniform injection of carriers from the source region into the drain region.

As to a drain in a typical structure, carriers are w injected into the drain via part of the boundary thereof, the part contacting with the channel region. In this case, the injected carriers are diffused in the drain and reach the cathode of the field emission electron source portion. Therefore, the concentration of the carriers is likely to vary depending on the position of the drain.

In the structure of this example, a single cathode is formed in the drain. Typically, several hundreds of cathodes are formed in the drain per pixel (multi-emitter structure) when the field emission electron source is used for pixels of an FED. When the carrier density varies in the drain, the amount of electrons emitted from the cathode is likely to vary depending on the position of the cathode. In this invention, carriers are injected uniformly and symmetrically through the gate electrode provided symmetrically with respect to the drain in which the cathode is formed, thereby preventing variation in electron emission in the drain.

Further, the extraction electrode of this invention effectively controls the beam path of emitted electrons as well as the electron emission amount. A relationship between voltage Vg applied to the gate electrode of the FET and extraction voltage Vex for operating the cathode is predetermined to an optimal condition while satisfying Vg<Vex. Accordingly, emitted electrons are affected by a field of Vg in vacuum and are then converged. This is because the potential of Vg which is lower than Vex generates a field which causes convergence of electrons moving from the cathode toward an anode opposed to the cathode. The gate electrode provided in a shape of a ring symmetrically with respect to the cathode generates a convergence field which is perfectly symmetrical with respect to the electron path, thereby obtaining a satisfactory lens action which is not available in the conventional example.

The gate electrode 77 causing the convergence action is provided as a wire buried between the first insulating layer 75 and the second insulating layer 76, and is positioned lower than the extraction electrode 79. Because of this relative arrangement, even when applied voltage Vg is relatively lower than voltage Vex, the cathode 74 is not affected by the gate electrode 77. In the conventional structure, an enhanced convergence function leads to a decrease in an electron emission amount. The structure of this invention can provide sufficient convergence while keeping an electron emission amount.

As described above, in this example, variation in electron emission in the drain is prevented, and the symmetrically disposed and ring-shaped gate electrode allows beam convergence. Therefore, extremely stable emitter operation having a small beam spread, i.e., high density, can be guaranteed. The structure thus obtained is thus believed to function as a satisfactory field emission electron source which is suitable for high definition display.

Note that, in the description of this example, a tower shape is an example of the shape of the cathode 74. The same effects are obtained with a conventional cone-type cathode shape. Although the p-type silicon substrate is processed to form the cathode 74 in this example, a conventional metal material (having a high melting point, such as molybdenum and tungsten) or carbon material (diamond, graphite, diamond-like carbon etc.) may be used to obtain the same effects.

It should be noted that the features of this invention in the above-described examples may be appropriately combined to construct an actual field emission type electron source device.

INDUSTRIAL APPLICABILITY

As described above, the field emission type electron source device according to this invention includes the drain end of the FET which includes a well having a low impurity concentration. For this reason, concentration of fields in the vicinity of the drain in operation of the FET can be significantly reduced. As a result, it is possible to prevent degradation of the FET performance which is conventionally caused by the hot electrons or the like. Therefore, reliability of device operation can be significantly improved, thereby providing advantages.

The utilization of a difference in thermal diffusion speed between impurity elements allows easy formation of a structure including a structure including a plurality of wells having different impurity concentrations, thereby providing advantages.

Further, when phosphorous which has a fast thermal diffusion speed and arsenic which has a slow thermal diffusion speed, both being used in a semiconductor process, are used as the impurity elements, it is possible to form an impurity profile having an excellent controllability, thereby providing advantages.

When a part of the channel gate of the FET is provided in such a manner as to cover the drain end region, the drain current density is decreased. As a result, it is possible to prevent degradation of FET performance due to the hot electrons, thereby providing advantages.

The transistor gate insulating film for the FET can be thin, and the insulating film for the field emission type electron source can be thick, thereby improving device performance. Moreover, the channel gate electrode is buried in the insulating film, so that the multilayer wiring can be easily provided. This is also suitable for a wiring for matrix drive.

When silicon thermal oxidization film is used as the gate insulating film, the control of the FET has an excellent controllability and a high level of reliability.

When the channel region of the FET other than the channel gate region is covered with the shield electrode, influences of an external field of ion charges in electron emission can be blocked.

Further, when the shield electrode is held at the same potential as the potential of the substrate, the shield effect against the external field can be enhanced.

When the gate electrode for control of the FET is provided symmetrically around the drain, uniform infection of electrons from the source to the drain can be obtained. Therefore, the uniformity of electron emission can be improved. In addition, when the gate electrode is positioned lower than the extraction electrode, the beam path is allowed to converge without a decrease in the field emission amount.

The use of the inversion layer generated by the extraction electrode allows the same function as that of the n-type semiconductor conductive layer, thereby simplifying a manufacturing process.

When the inner portion of the source and the outer portion of the drain each have a shape of a concentric circular, uniform injection of carriers from the source to the drain can be obtained. Therefore, a satisfactory character of a transistor can be obtained.

When the gate electrode of the FET is a shape of a ring symmetrical around the drain, convergence of the electron path can be secured.

When voltage Vg applied to the gate electrode and voltage Vex applied to the extraction electrode has a relationship such that Vg<Vex, a negative field action is caused for electrons emitted from the cathode. Therefore, convergence of the electron path can be secured.

What is claimed is:

1. A field emission type electron source device comprising:
    a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and
    an n-channel field effect transistor portion provided on the p-type silicon substrate, corresponding to the field emission electron source portion,
    wherein:
    the field emission electron source portion is provided in a drain region of the field effect transistor portion; and a control voltage is applied to a gate electrode of the field effect transistor portion to control a field emission current from the field emission electron source portion;
    the drain region includes different impurity elements and includes at least two wells having different impurity concentrations having symmetrical impurity distributions; and of the at least two wells, one well having a low impurity concentration is provided around a circumference of the other well having a higher impurity concentration.

2. A field emission type electron source device according to claim 1, wherein as the impurity elements the drain region includes at least two n-type impurity elements having different thermal diffusion speeds in the silicon substrate.

3. A field emission type electron source device according to claim 1, wherein as the impurity elements, the drain region includes phosphorous, having a fast thermal diffusion speed and arsenic, having a slow thermal diffusion speed in the silicon substrate.

4. A field emission type electron source device comprising:
    a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and
    an n-channel field effect transistor portion provided on the p-type silicon substrate, corresponding to the field emission electron source portion,
    wherein:
    the field emission electron source portion is provided in a drain region of the field effect transistor portion; and a control voltage is applied to a gate electrode of the field effect transistor portion to control a field emission current from the field emission electron source portion;
    the gate electrode of the field effect transistor portion has a shape such that a portion of the gate electrode nearer the drain region has a total width wider than a total width of a portion of the source electrode nearer the source region; and a part of the gate electrode is provided in such a manner as to cover an end of the drain region.

5. A field emission type electron source device comprising:
    a field emission electron source portion including an extraction electrode provided on a p-type silicon substrate via a first insulating film and having an opening portion at a position corresponding to a region where a cathode is provided; and
    a cathode portion provided on the p-type silicon substrate and at a position corresponding to the opening portion of the extraction electrode; and
    an n-channel field effect transistor portion provided on the p-type silicon substrate, corresponding to the field emission electron source portion,
    wherein:
    the field emission electron source portion is provided in a drain region of the field effect transistor portion; and
    a control voltage is applied to a gate electrode of the field effect transistor portion to control a field emission current from the field emission electron source portion;
    the drain region including at least two wells having different impurity concentrations, a first of the at least two wells being provided around a circumference of the second of the at least two wells;
    a gate insulating film formed by thermal oxidation of silicon is provided between the gate electrode of the field effect transistor and the p-type silicon substrate;
    the gate insulating film is a film thinner than the first insulating film, the first insulating film being provided between the extraction electrode and the p-type silicon substrate; and the gate electrode is buried with the first insulating film.

6. A field emission type electron source device according to claim 5, wherein the gate insulating film includes a thermally oxidized silicon film, provided by a step of thermal oxidization for sharpening treatment for sharpening a tip of the cathode portion of the field emission electron source portion.

7. A field emission type electron source device comprising:

a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electrode source portion, wherein:

the field emission electron source portion is provided in a drain region of the field effect transistor portion; and a control voltage is applied to a gate electrode of the field effect transistor portion to control a field emission current from the field emission electron source portion;

the field emission type electron source device further comprises a shield electrode made of the same material of that of the gate electrode of the field effect transistor portion, and the shield electrode is provided in such a manner as to cover a channel region of the field effect transistor portion which is not covered with the gate electrode, while the potential of said shield electrode is made to be equal to that of the substrate.

8. A field emission type electron source device comprising:

a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electron source portion, wherein:

the field emission electron source portion is provided in a drain region of the field effect transistor portion; and a control voltage is applied to a gate electrode of the field effect transistor portion to control a field emission current from the field emission electron source portion;

the drain region of the field effect transistor portion is provided in a source region of the field effect transistor portion in such a way to be surrounded by the source region; and the gate electrode of the field effect transistor portion is positioned symmetrical in a plane with respect to the cathode portion of the field emission electron source portion.

9. A field emission type electron source device according to claim 8, wherein the drain region includes a p-type conductive layer.

10. A field emission type electron source device according to claim 8, wherein an outer portion of the drain region contacts the channel region of the field effect transistor portion; and the outer region of the drain region and an inner portion of the source region have a shape of concentric circles.

11. A field emission type electron source device according to claim 8, wherein at least a part of the gate electrode provided between the source region and the drain region has a shape of a symmetrical circular arc.

12. A field emission type electron source device according to claim 8, wherein first voltage Vex applied to the extraction electrode of the field emission electron source portion and second voltage Vg applied to the gate electrode of the field effect transistor portion have a relationship such that $Vg<Vex$.

13. A field emission type electron source device according to claim 1, wherein the extraction electrode is provided in a region above the drain region and away from an interface between regions of different impurity concentrations.

14. A field emission type electron source device according to claim 4, wherein the extraction electrode is provided in a region above the drain region and away from an interface between regions of different impurity concentrations.

15. A field emission type electron source device according to claim 5, wherein the extraction electrode is provided in a region above the drain region and away from an interface between regions of different impurity concentrations.

16. A field emission type electron source device according to claim 7, wherein the extraction electrode is provided in a region above the drain region and away from an interface between regions of different impurity concentrations.

17. A field emission type electron source device comprising:

a field emission electron source portion including an extraction electrode provided on a p-type silicon substrate via an insulating film and having an opening portion at a position corresponding to a region where a cathode is provided; and a cathode portion provided on the p-type silicon substrate and at a position corresponding to the opening portion of the extraction electrode; and an n-channel field effect transistor portion provided on the p-type silicon substrate, corresponding to the field emission electron source portion, wherein:

the field emission electron source portion is provided in a drain region of the field effect transistor portion; and a control voltage is applied to a gate electrode of the field effect transistor portion to control a field emission current from the field emission electron source portion;

the drain region of the field effect transistor portion is provided in a source region of the field effect transistor portion in such a way to be surrounded by the source region; and the gate electrode of the field effect transistor portion is positioned symmetrical in a plane with respect to the cathode portion of the field emission electron source portion and lower than the extraction electrode.

18. A field emission type electron source device according to claim 17, wherein the drain region includes a p-type conductive layer.

19. A field emission type electron source device according to claim 17, wherein an outer portion of the drain region contacts the channel region of the field effect transistor portion; and the outer region of the drain region and an inner portion of the source region have a shape of concentric circles.

20. A field emission type electron source device according to claim 17, wherein at least a part of the gate electrode provided between the source region and the drain region has a shape of a symmetrical circular arc.

21. A field emission type electron source device according to claim 17, wherein first voltage Vex applied to the extraction electrode of the field emission electron source portion and second voltage Vg applied to the gate electrode of the field effect transistor portion have a relationship such that Vg<Vex.

* * * * *